(12) United States Patent
Kuo

(10) Patent No.: US 7,049,801 B2
(45) Date of Patent: May 23, 2006

(54) ADAPTIVE DUAL-SLOPE FREQUENCY CONTROLLER FOR ADJUSTING POWER CONVERSION

(75) Inventor: Ming-Ying Kuo, Hsinchu (TW)

(73) Assignee: Leadtrend Technology Corp., Hsinchu (TW)

( * ) Notice: Subject to any disclaimer, the term of this patent is extended or adjusted under 35 U.S.C. 154(b) by 47 days.

(21) Appl. No.: 10/965,299

(22) Filed: Oct. 14, 2004

(65) Prior Publication Data
US 2005/0270008 A1    Dec. 8, 2005

(30) Foreign Application Priority Data
Jun. 4, 2004    (TW) ................ 93116136 A

(51) Int. Cl.
*G05F 1/40* (2006.01)
(52) U.S. Cl. .................. 323/288; 323/285; 363/41
(58) Field of Classification Search ................ 323/242, 323/272, 275, 276, 277, 282, 283, 284, 285, 323/288; 363/41; 327/175
See application file for complete search history.

(56) References Cited

U.S. PATENT DOCUMENTS

| | | | |
|---|---|---|---|
| 5,142,217 A * | 8/1992 | Gontowski, Jr. ............ | 323/272 |
| 6,121,805 A * | 9/2000 | Thamsirianunt et al. .... | 327/175 |
| 2004/0207373 A1* | 10/2004 | Muller et al. ............... | 323/282 |

* cited by examiner

*Primary Examiner*—Jessica Han
(74) *Attorney, Agent, or Firm*—Welsh & Katz, Ltd.

(57) ABSTRACT

This specification discloses a adaptive dual-slope frequency controller for adjusting power conversion of a power supply. The converter can adjust its operating frequency according to the status of a load device. A feedback voltage, representing the load status, is used to control two pairs of charging/discharging currents of a storage capacitor in the present controller, thereby controlling the period of the voltage waveform at the capacitor. This controller can especially lower the frequency of the gate pulse of power supply to improve the overall efficiency at light load and no load.

5 Claims, 11 Drawing Sheets

US 7,049,801 B2

ADAPTIVE DUAL-SLOPE FREQUENCY CONTROLLER FOR ADJUSTING POWER CONVERSION

BACKGROUND OF THE INVENTION

1. Field of Invention

The invention relates to a frequency controller for adjusting power conversion and, in particular, to a adaptive dual-slope frequency controller for adjusting power conversion.

2. Related Art

In the circuit of the power supply 2 shown in FIG. 1, the power converter 4 is used to receive an external input voltage Vin and to provide an output voltage Vo to the load device 6. The feedback control circuit 8 outputs an appropriate gate pulse to the power converter 4 according to the output voltage Vo in order to provide an appropriate power to the load device 6. For example, when the load device 6 is at heavy load, the feedback control circuit 8 makes the power converter 4 to provide a larger power output to satisfy the system's needs. On the other hand, if the load device 6 is at light load, the feedback control circuit 8 makes the power converter 4 to provide a smaller power output to save energy. The power converter 4 can be a buck converter, a boost converter, a fly back converter, or a forward converter, depending upon different specification needs. The feedback control circuit 8 mostly adjusts the output power of the power converter 4 by pulse width modulation (PWM). From the above description, it is seen that the feedback control circuit 8 is the key role of affecting the efficiency of a power supply 2.

FIG. 2 is the block diagram of a conventional feedback control circuit 8. It includes an error amplifier 11, a reference voltage generator 12, a comparator, 13, an oscillator 14, an SR inverter 15, a gate drive 16, and feedback compensation circuits 17, 18.

We use FIG. 3 to describe the principle of the conventional feedback control circuit 8. When an output voltage Vo enters the positive terminal of the error amplifier 11 via the feedback compensation circuit 18, the error amplifier 11 compares it with a reference voltage Vref generated by the reference voltage generator 12. It further feeds an amplified error voltage Ve to the positive terminals of the feedback compensation circuit 17 and the comparator 13. The feedback compensation circuits 17, 18 are circuits composed of resistors and capacitors. Their purpose is to stabilize the closed-loop feedback compensation of the power supply 2.

The comparator 13 compares the error voltage Ve and the voltage on the switch current CS of the switch chip (not shown) in order to generate a reset signal to the SR flip-flop 15. If the voltage is smaller than the voltage on the switch current CS of the switch chip, then the reset signal is a low voltage and so is the gate pulse. If the voltage is greater than the voltage on the switch current CS of the switch chip, then the reset signal is a high voltage and the voltage of the gate pulse is determined by the oscillation output signal CLK-OUT of the oscillator 14. On the other hand, the oscillation output signal CLKOUT generated by the oscillator 14 periodically restores the gate pulse to the high voltage.

Therefore, the pulse width of the gate pulse determines the output power of the power converter 4. However, the frequency of the oscillation output signal CLKOUT is fixed. This in turn infers that the frequency of the gate pulse is also fixed. A fixed gate pulse will result in large power consumption in light load and no load conditions.

SUMMARY OF THE INVENTION

A primary objective of the invention is to provide a adaptive dual-slope frequency controller, which enables a power converter to adjust its operating frequency according to the load status of the load device.

The present controller accomplishes the frequency modulation by controlling the charge/discharge current of the capacitor by an error voltage Ve. The period of the voltage Vramp at the capacitor can thus be controlled to adjust the frequency of the gate pulse.

The disclosed adaptive dual-slope frequency controller contains a storage capacitor; a first charging current source coupled to the capacitor via a first switch; a first discharging current source coupled to the capacitor via a second switch; a second charging current source coupled to the capacitor via a third switch; a second discharging source coupled to the capacitor via a fourth switch; a conversion circuit to receive an error voltage Ve and output a corresponding conversion signal to the charging current sources; and a control circuit to receive the voltage at the capacitor, a high-level voltage reference, and a low-level voltage reference and output a control signal and an output pulse. The control signal controls the charge/discharge current on the first charging current source, the first discharging current source, the second charging current source, and the second discharging current source to control the period of the voltage waveform at the capacitor, thereby controlling the frequency of a gate pulse.

BRIEF DESCRIPTION OF THE DRAWINGS

The invention will become more fully understood from the detailed description given hereinafter illustration only, and thus are not limitative of the present invention, and wherein:

FIG. 9-1 shows the relation between the error voltage Ve and the charging current Ic2 in the first embodiment;

FIG. 9-2 shows the relation between the error voltage Ve and the capacitor charging time Tc2 in the first embodiment;

FIG. 9-3 shows the relation between the error voltage Ve and the work frequency f in the first embodiment;

FIG. 10-1 shows the relation between the error voltage Ve and the charging current Ic2 in the second embodiment;

FIG. 10-2 shows the relation between the error voltage Ve and the capacitor charging time Tc2 in the second embodiment;

FIG. 10-3 shows the relation between the error voltage Ve and the work frequency f in the second embodiment.

DETAILED DESCRIPTION OF THE INVENTION

Figure 4:
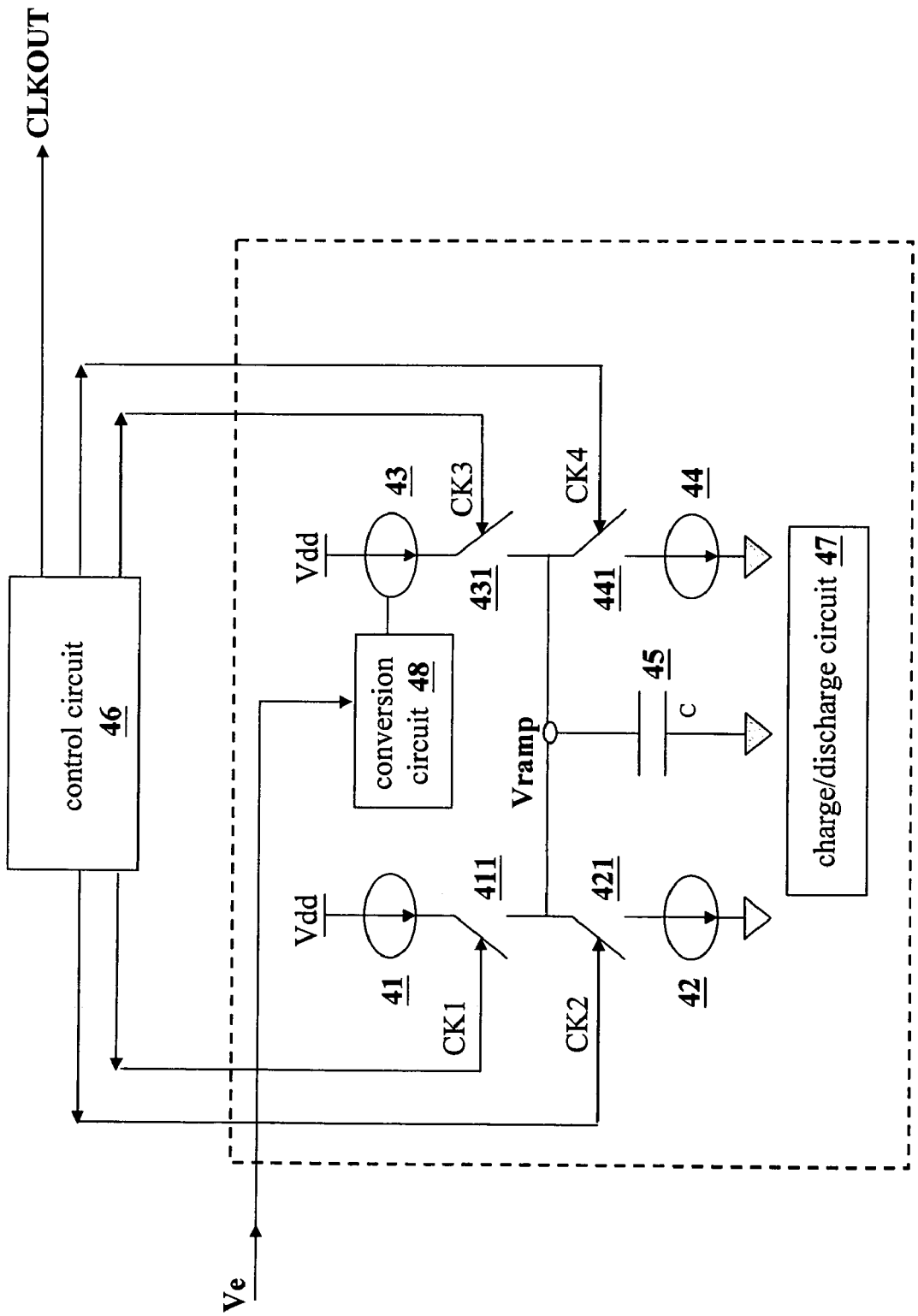
FIG. 4 is a block diagram of the disclosed adaptive dual-slope frequency controller.

As shown in FIG. 4, the disclosed adaptive dual-slope frequency controller 40 contains four sets of current sources: the first charging current source Ic1 41, the first discharging current source Id1 42, the second charging current source Ic2 43, and the second discharging current source Id2 44; four sets of current control switches: the first switch SW1 411, the second switch SW2 421, the third switch SW3 431, and the fourth switch SW4 441; a storage capacitor 45, a control circuit 46, a charge/discharge circuit 47, and a conversion circuit 48.

The storage capacitor 45 is used to perform charge/discharge. The first charging current source Ic1 41 is coupled to the storage capacitor 45 via the first switch SW1 411. The first discharging current source Id1 42 is coupled to the storage capacitor 45 via the second switch SW2 421. The second charging current source Ic2 43 is coupled to the storage capacitor 45 via the third switch SW3 431. The second discharging source Id2 44 is coupled to the storage capacitor 45 via the fourth switch SW4 441. The conversion circuit 48 refers to an error voltage Ve and outputs a corresponding conversion signal to the second charging current source Ic2 43, adjusting the charging current absorbed by the second charging current source Ic2 43. According to the voltage on the switch current CS, a reset signal is output to a corresponding switch SW1~SW4. However, the conversion circuit 48 can be coupled to any of the current sources 41~44 in a single or multiple means. It is not limited by the embodiment disclosed herein.

The control circuit 46 is used to receive a capacitor voltage Vramp, a high voltage reference VH, a low voltage reference VL, and to output a control signal (including a first and a second control signals) and an output pulse CLKOUT. A main feature of the invention is in that the control signal controls the charging/discharging current of the storage capacitor 45 via the first charging current source Ic1 41, the first discharging current source Id1 42, the second charging current source Ic2 43, and the second discharging source Id2 44. The period of the capacitor voltage Vramp is thus controlled to adjust the frequency of a gate pulse.

Figure 5:
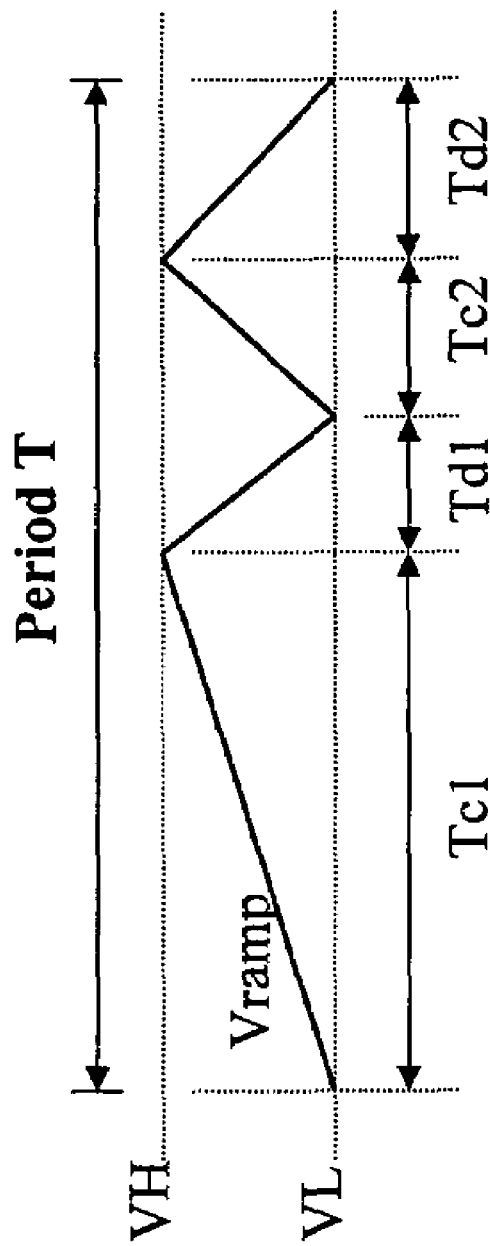
FIG. 5 is a schematic view showing the oscillation period and the operation of the four switches according to the invention.

FIG. 5 schematically shows the oscillation period and the operation of the four switches. The oscillation period T of the disclosed adaptive dual-slope frequency controller is equal to Tc1+Td1+Tc2+Td2. When the storage capacitor 45 is charged for the first time Tc1, the first switch 411 is is conductive while the second, third, and fourth switches 421, 431, 441 are turned off. When the storage capacitor 45 is discharged for the first time Td1, the second switch 421 is is conductive while the first, third, and fourth switches 411, 431, 441 are turned off. When the storage capacitor 45 is charged for the second time Tc2, the third switch 431 is is conductive while the first, second, and fourth switches 411, 421, 441 are turned off. When the storage capacitor 45 is discharged for the second time Td2, the fourth switch 441 is conductive while the first, second, and third switches 411, 421, 431 are turned off.

Figure 6:
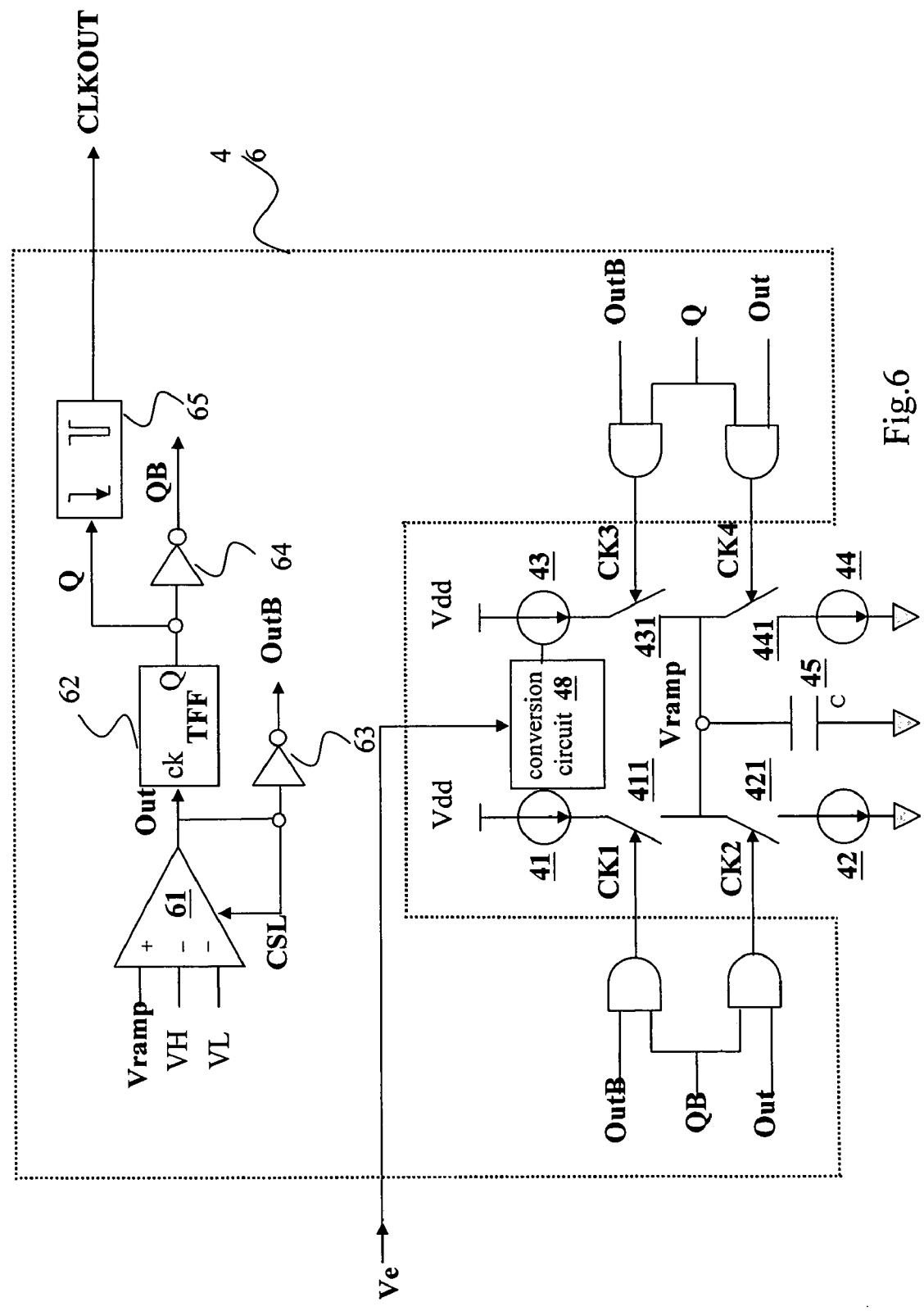
FIG. 6 is a circuit diagram of the disclosed adaptive dual-slope frequency controller.

The control circuit 46 shown in FIG. 6 contains: a comparator 61, a T flip-flop 62, a first inverter 63, a second inverter 64, and a pulse generator 65. The comparator 61 uses two negative-terminal reference voltages VH, VL and a positive-terminal capacitor charge/discharge voltage signal Vramp to control its output. The switch between VH and VL is further controlled by a first control signal CSL output of the comparator 61. When the first control signal is Hi, the negative-terminal reference voltage of the comparator 61 is switched from VH to VL. When the output signal CSL is LO, the negative terminal reference voltage of the comparator 61 is switched from VL to VH. OUTB is the control output signal of the first inverter 63. The T flip-flop 62 receives the first control signal OUT and, after a negative-edge trigger, outputs a second control signal. The pulse generator 65 here is preferably to be a negative-edge trigger pulse generator 65 that outputs a pulse CLKOUT. However, it should not be taken to restrict the scope of the invention. The disclosed control circuit 46 makes use of the output control signals CK1, CK2, CK3, and CK4 of two sets of logic control circuits. CK1 and CK2 determine the first capacitor charge/discharge period, and CK3 and CK4 determine the second capacitor charge/discharge period. CK1, CK2, CK3, and CK4 are enabled by the T flip-flop 62 outputting a second control signal Q and the control signal QB of second inverter 64.

Figure 7:
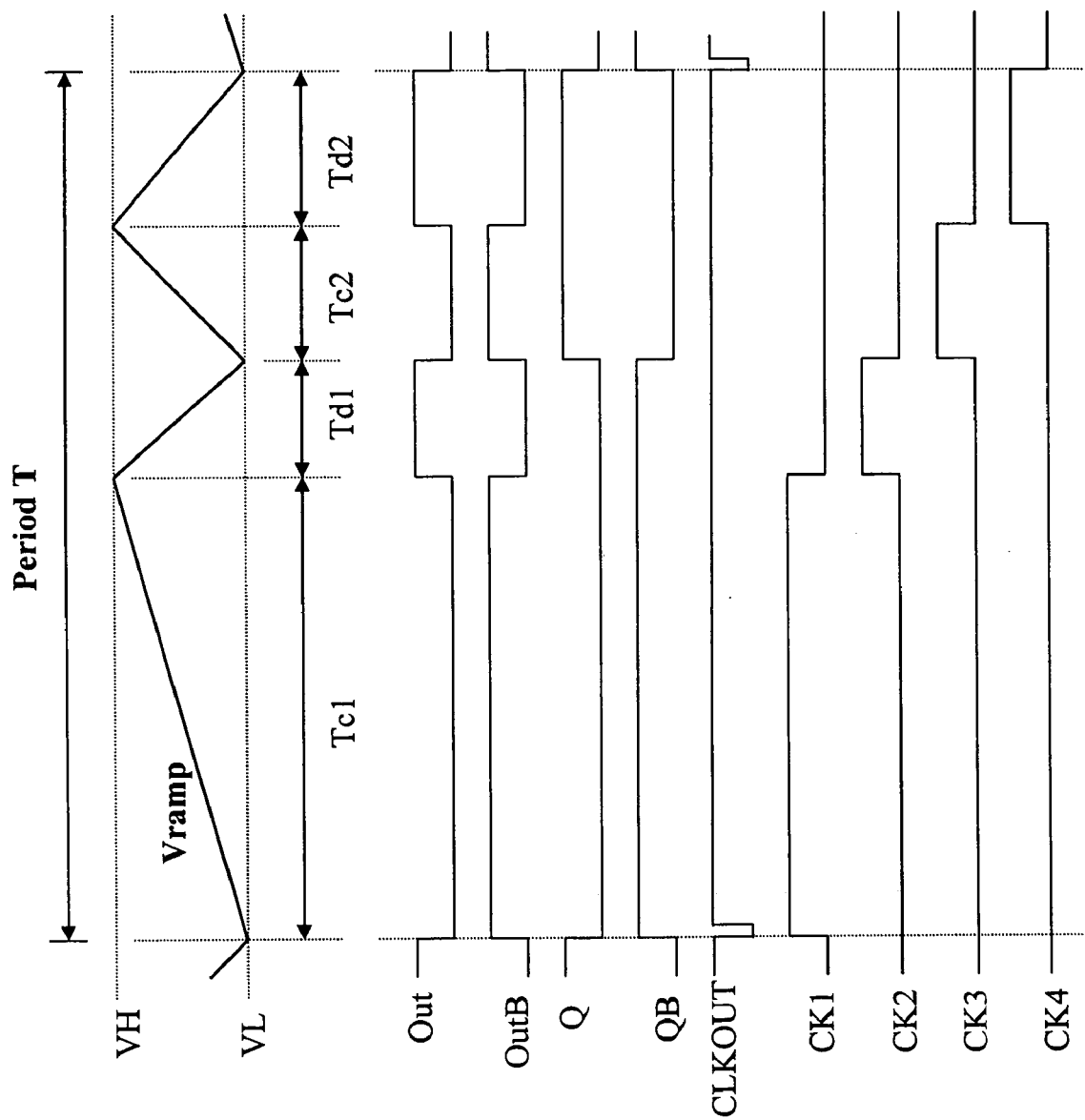
FIG. 7 is a time-ordering diagram of the oscillation period and the four switches according to the invention.

In the following, we use FIG. 7 to describe the action of the circuit.

When the storage capacitor 45 is charged for the first time Tc1: When the input capacitor voltage Vramp on the positive terminal of the comparator 61 exceeds the negative terminal input reference voltage VH, the output of the comparator 61 is turned to Hi. The output of the T flip-flop 62 is unchanged, remaining at Lo. CK1 turns to Lo, and CK2 turns to Hi. The storage capacitor 45 starts to discharge. At the same time, the negative terminal reference voltage of the comparator 61 is transited from VH to VL.

When the storage capacitor 45 is discharged for the first time Td1: After the end of the Tc1 period, the negative terminal reference voltage of the comparator 61 is transited from VH to VL. When the positive terminal input capacitor voltage Vramp of the comparator 61 is lower than the negative terminal input reference voltage VL, the output OUT of the comparator 61 further is turned to Lo. The T flip-flop 62 is triggered so that its output Q changed to Hi. Therefore, CK2 turns to Lo, and CK3 turns to Hi. The storage capacitor 45 is further charged. At the same time, the negative terminal reference voltage of the comparator 61 is switched from VL to VH.

When the storage capacitor 45 is charged for the second time Tc2: When the positive terminal input capacitor voltage Vramp of the comparator 61 exceeds the negative terminal input reference voltage VH, the output OUT of the comparator 61 is turned to Hi. The output of the T flip-flop 62 is unchanged, remaining at Hi. CK3 turns to LO, and CK4 turns to Hi. The storage capacitor 45 starts to discharge. At the same time, the negative terminal reference voltage of the comparator 61 is switched from VH to VL.

When the storage capacitor 45 is discharged for the second time Td2: After the end of the Tc2 period, the negative reference voltage of the comparator 61 is switched from VH to VL. When the positive terminal input capacitor voltage Vramp of the comparator 61 is lower than the negative terminal input reference voltage VL, the output of the comparator 61 further changes to Lo. The T flip-flop 62 is triggered so that its output Q changes to Lo. At the same time, the triggering negative edge triggers the pulse generator 65 to output a pulse CLKOUT, enabling the start of the next period. CK4 turns to Lo, and CK turns to Hi. The storage capacitor 45 is charged again. The negative terminal reference voltage of the comparator 61 is switched from VL to VH.

Figure 8:
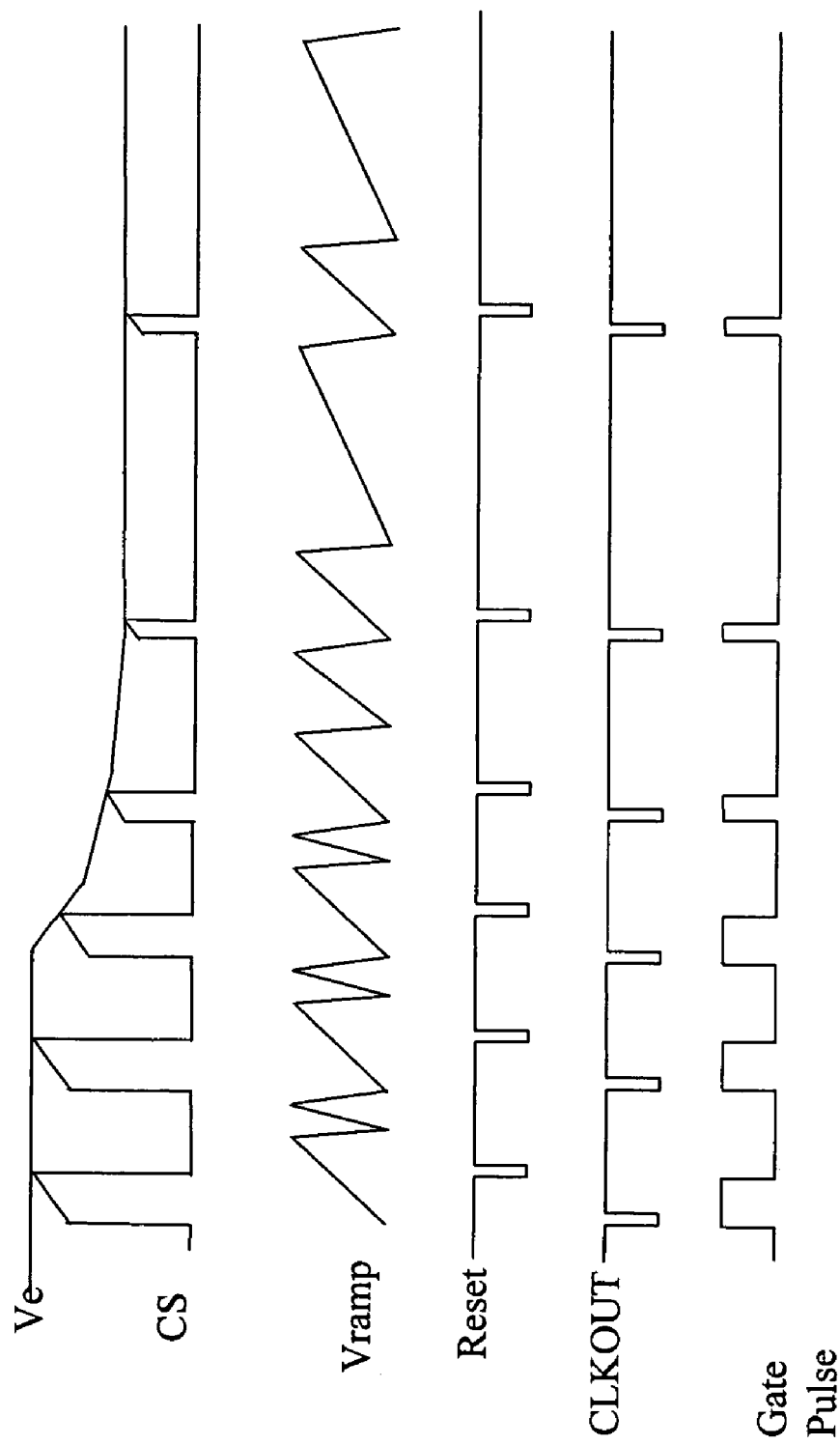
FIG. 8 is a time-ordering diagram of the disclosed adaptive dual-slope frequency controller.

To summarize, we use FIG. 8 to show the timing chart of the operations of the disclosed adaptive dual-slope frequency control circuit. The error voltage Ve and the switch current CS determines when to generate a reset signal. Dual-slope voltage signal (Vramp) determines one period of enabling pulse wave, CLKOUT. The reset signal determines when to shut down the gate pulse, and the CLKOUT signal determines when to enable it.

Figure 1:
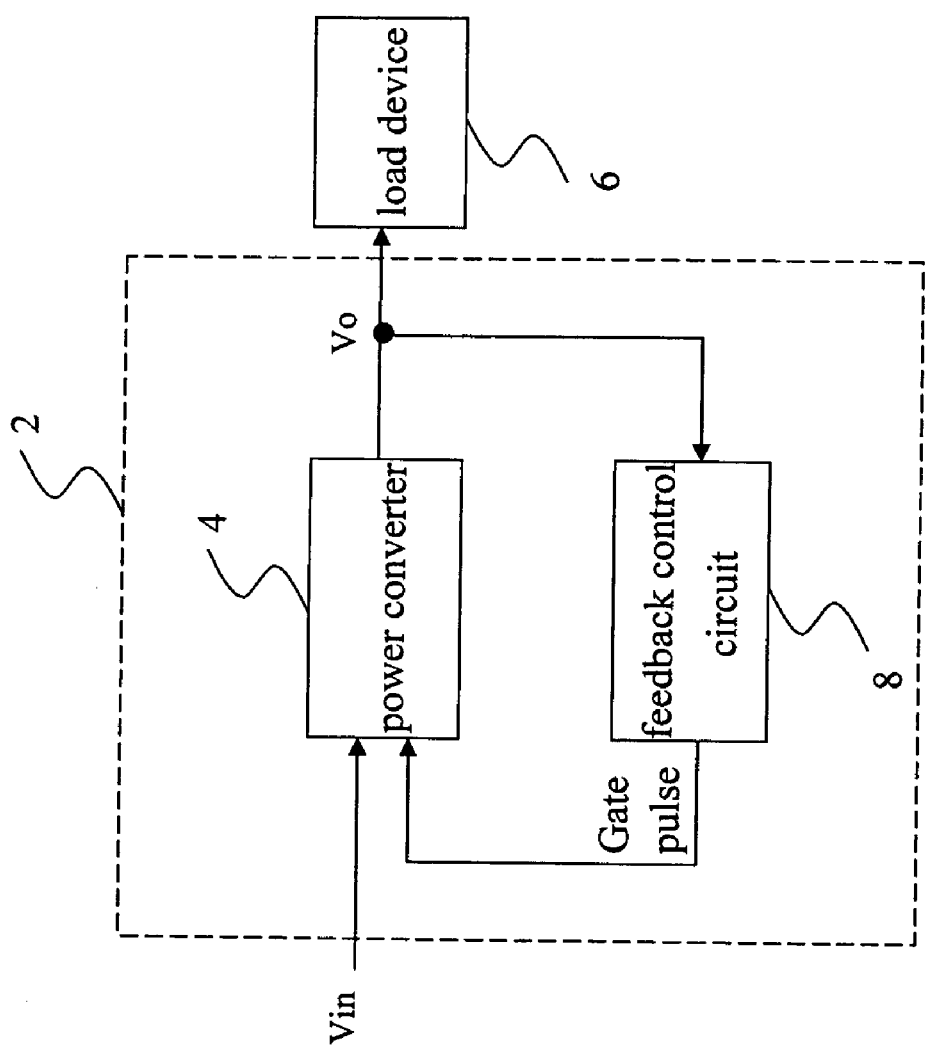
FIG. 1 is a schematic view of a conventional power supply circuit.
Figure 2:
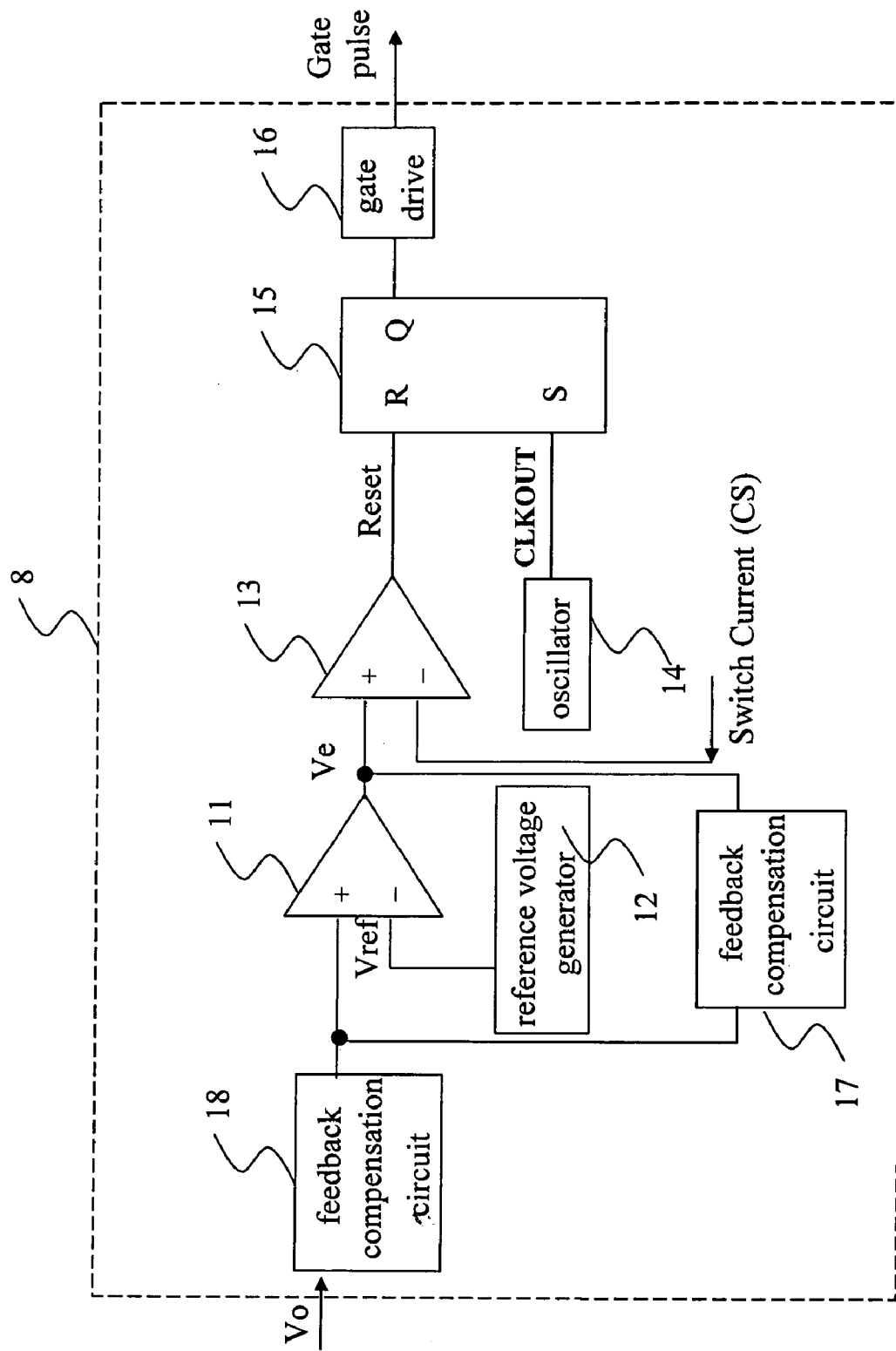
FIG. 2 is a block diagram of the conventional feedback control circuit.
Figure 3:
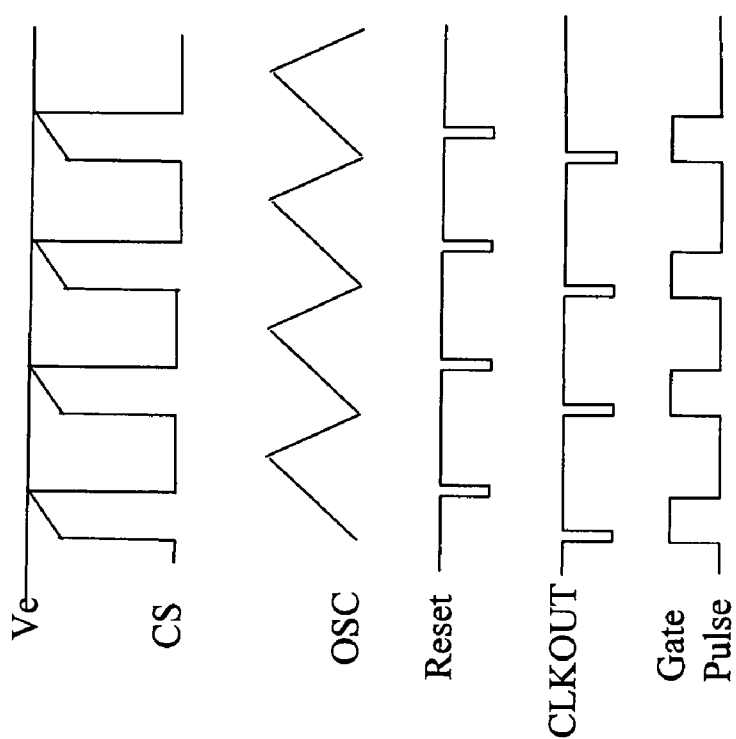
FIG. 3 is a time-ordering diagram of the operations of a conventional feedback control circuit.
Figures 1, 9:
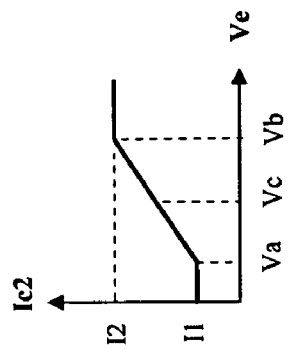
FIG. 9 is a first embodiment circuit diagram of the disclosed adaptive dual-slope frequency controller.
Figures 2, 9:
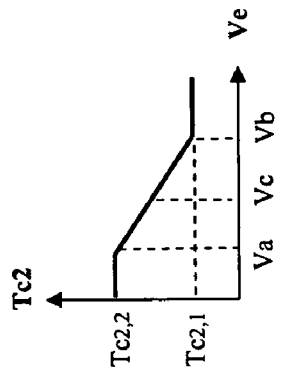
Figures 3, 9:
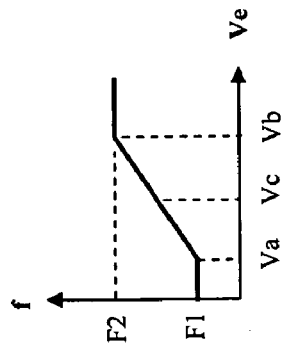
Figure 9:
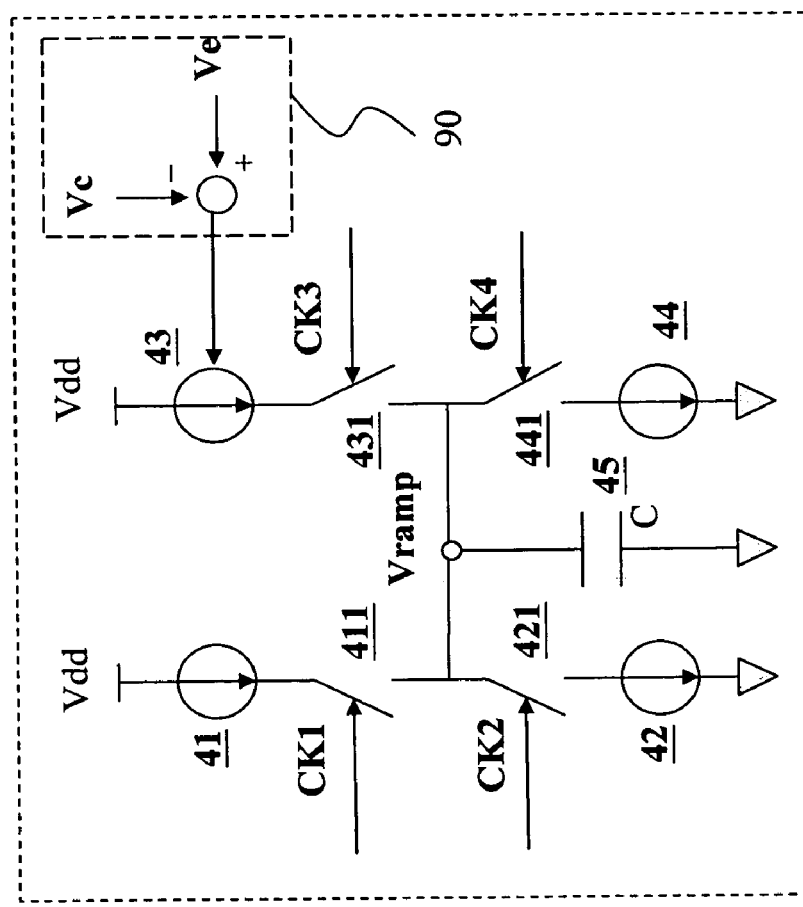

Therefore, the invention uses the error voltage Ve that enters the conversion circuit 48 to control the charge/discharge current of the storage capacitor 45, thereby controlling the period of the Vramp. In the end, the invention achieves the goal of controlling the frequency of the gate pulse. FIG. 9 is a first embodiment circuit of the disclosed adaptive dual-slope frequency control circuit. The conversion circuit 90 is another embodiment of the conversion circuit 48 in FIG. 6. The conversion circuit 90 uses an adder to subtract a certain voltage Vc from the error voltage Ve, the result of which controls the voltage and outputs a corresponding conversion signal to the second charging current source Ic2 43, adjusting its charging current. Thus, the second charging current source Ic2 43 and the error voltage Ve have a functional relation. It can be a first-order, second-order, or exponential function; however, the invention is not limited by these examples. With reference to FIGS. 9-1 to 9-3, when the power supply is at a heavy load, the second charging current source Ic2 43 extracts a maximum current I2 to charge the storage capacitor 45. At this moment, the frequency of the oscillation output signal CLKOUT is the highest frequency F2 and the charge period is the shortest Tc2,1. When the load reduces to its minimum, the second charging current source Ic2 43 extracts a minimum current I1 to charge the storage capacitor 45. At this moment, the frequency of the oscillation output signal CLKOUT reaches its minimum frequency F1 and the charge period reaches its maximum Tc2,2.

Figures 1, 10:
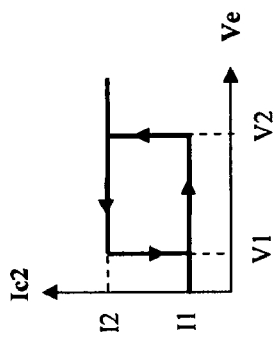
FIG. 10 is a second embodiment circuit diagram of the disclosed adaptive dual-slope frequency controller.
Figures 2, 10:
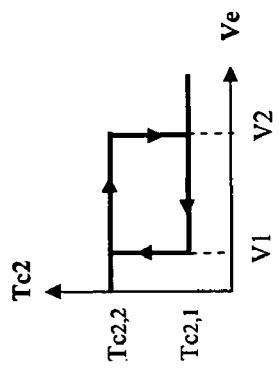
Figures 3, 10:
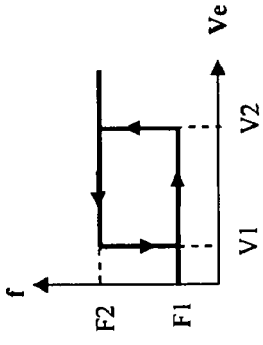
Figure 10:
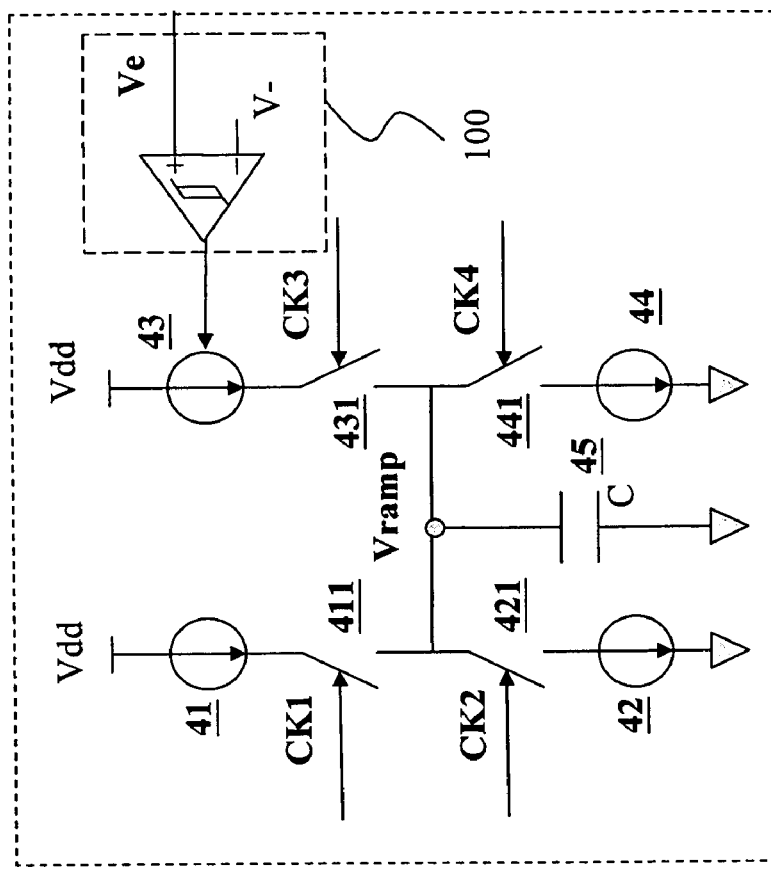

FIG. 10 shows a second embodiment circuit diagram of the disclosed adaptive dual-slope frequency control circuit. The conversion circuit 100 is another embodiment of the conversion circuit 48 in FIG. 6. The conversion circuit 100 uses a comparator with a hysteresis. The hysteresis phenomenon of the amplifier is used to reduce the sensitivity of the comparator to the error voltage Ve. When the error voltage Ve is greater than a larger voltage V2 or smaller than a smaller voltage V1, the output signal of the amplifier can enable the function of the second charging current Ic2 43. If the error voltage Ve is between the larger voltage V2 and the smaller voltage V1, the output signal of the comparator is unchanged. With reference to FIGS. 10-1 to 10-3, when the power supply is at a heavy load, the second charging current source Ic2 43 extracts a maximum current I2 to charge the storage capacitor 45. At this moment, the frequency of the oscillation output signal CLKOUT is the highest frequency F2 and the charge period is the shortest Tc2,1. When the load reduces to its minimum, the second charging current source Ic2 43 extracts a minimum current I1 to charge the storage capacitor 45. At this moment, the frequency of the oscillation output signal CLKOUT reaches its minimum frequency F1 and the charge period reaches its maximum Tc2,2.

Figure 11:
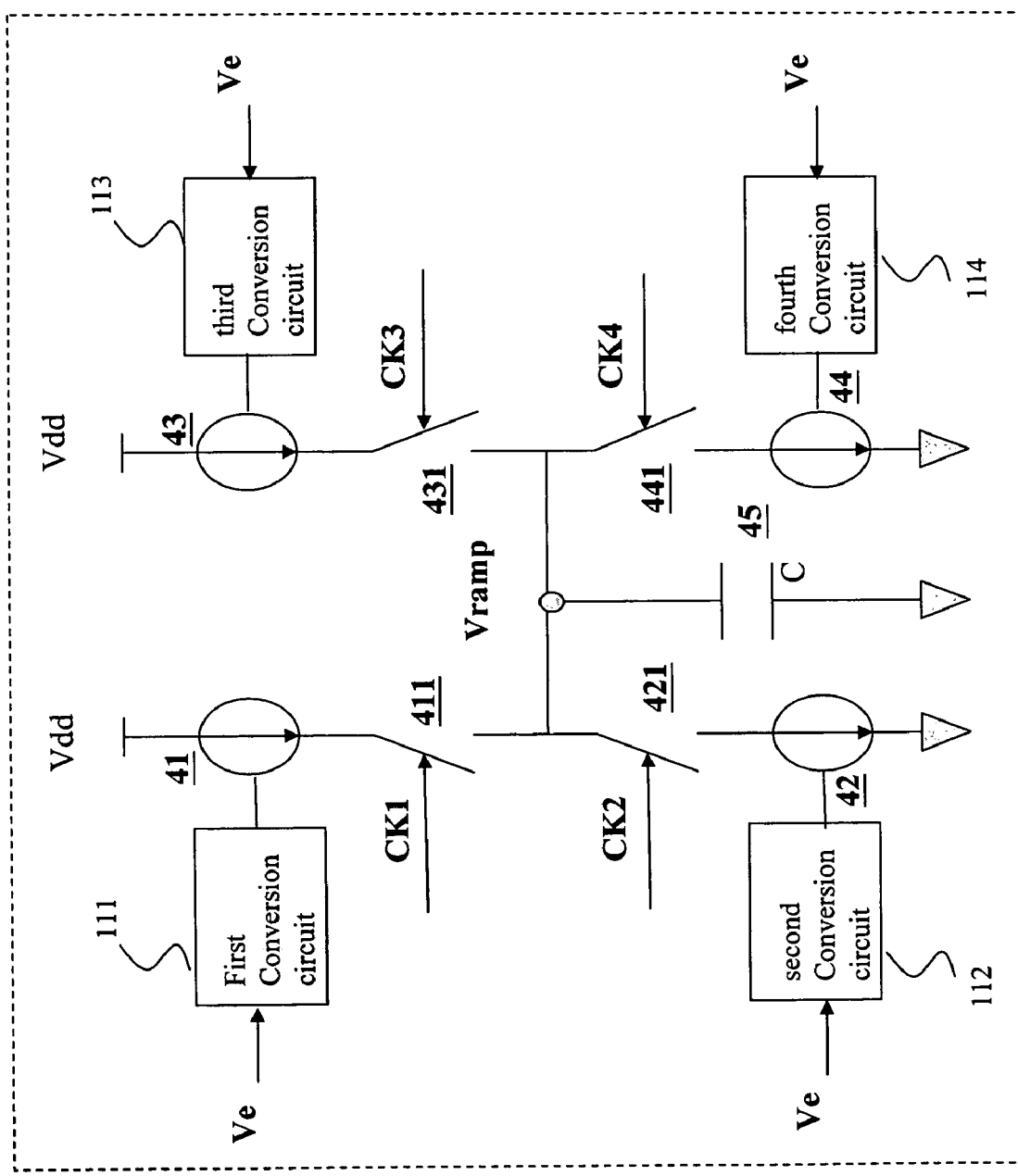
FIG. 11 is a third embodiment circuit diagram of the disclosed adaptive dual-slope frequency controller.

FIG. 11 is a third embodiment circuit diagram of the disclosed adaptive dual-slope frequency control circuit. As a further embodiment of the conversion circuit 48 in FIG. 6, it is different from others in that the first charging current source Ic1 41, the first discharging current source Id1 42, the second charging current source Ic2 43, and the second discharging current source Id2 44 are coupled to the first conversion circuit 111, the second conversion circuit 112, the third conversion circuit 113, and the fourth conversion circuit 114, respectively. Each of them uses its own conversion circuit 111~114 to output a conversion signal corresponding to the error voltage Ve to the corresponding current source 41~44. The charge currents or discharge currents extracted by the current sources 41~44 are thus adjusted. A reset signal is output according to the voltage of the switch current CS to the corresponding switch SW1~SW4, achieving the same charge/discharge effects as described above.

The first conversion circuit 111 refers to the error voltage Ve and outputs a corresponding conversion signal to the first charging current source Ic1 41. The first charging current source Ic1 41 couples the first switch 411 to the storage capacitor 45. The first switch 411 determines the first charge period. The second conversion circuit 112 refers to the error voltage Ve and outputs a corresponding conversion signal to the first discharging current source Id1 42. The first discharging current source Id1 42 couples the second switch 421 to the storage capacitor 45. The second switch 421 determines the first discharge period. The third conversion circuit 113 refers to the error voltage Ve and outputs a corresponding conversion signal to the second charging current source Ic2 43. The third charging current source Ic2 43 couples the third switch 431 to the storage capacitor 45. The third switch 431 determines the second charge period. The fourth conversion circuit 114 refers to the error voltage Ve and outputs a corresponding conversion signal to the second discharging current source Id2 44. The second discharging current source Id2 44 couples the fourth switch 441 to the storage capacitor 45. The fourth switch 441 determines the second discharge period.

Certain variations would be apparent to those skilled in the art, which variations are considered within the spirit and scope of the claimed invention.

What is claimed is:

1. A adaptive dual-slope frequency controller for adjusting power conversion, comprising:
   a storage capacitor to charge/discharge;
   a first charging current source coupled to the storage capacitor via a first switch;
   a first discharging current source coupled to the storage capacitor via a second switch;
   a second charging current source coupled to the storage capacitor via a third switch;
   a second discharging source coupled to the storage capacitor via a fourth switch;
   at least one conversion circuit to receive an error voltage and output a corresponding conversion signal to any of the charging/discharging current sources to adjust the charge/discharge current extracted by the current source; and
   a control circuit to receive a capacitor voltage, a high voltage reference, and a low voltage reference and output a control signal and an output pulse;
   wherein the control signal controls the charge/discharge current on the first charging current source, the first discharging current source, the second charging current source, and the second discharging current source to control the charge/discharge current of the storage capacitor, thereby controlling the period of the capacitor voltage and thus the frequency of a gate pulse.

2. The adaptive dual-slope frequency controller for adjusting power conversion of claim 1, wherein the switches use the voltage of a switch current to output a reset signal to the corresponding switch for switching.

3. The adaptive dual-slope frequency controller for adjusting power conversion of claim 1 further comprising:
- a comparator, which receives the capacitor voltage, the high reference voltage, and the low reference voltage and outputs a first control signal;
- a flip-flop, which receives the first control signal and, through a negative-edge trigger, outputs a second control signal;
- a first inverter, which receives the first control signal and outputs a first inverted control signal;
- a second inverter, which receives the second control signal and outputs a second inverted control signal; and
- a pulse wave generator, which receives the second control signal and outputs the output wave.

4. The adaptive dual-slope frequency controller for adjusting power conversion of claim 1, wherein the conversion circuit is an adder.

5. The adaptive dual-slope frequency controller for adjusting power conversion of claim 1, wherein the conversion circuit is a comparator.

* * * * *